United States Patent
Rippon et al.

(10) Patent No.: US 10,459,025 B1
(45) Date of Patent: Oct. 29, 2019

(54) SYSTEM TO REDUCE START-UP TIMES IN LINE-MOUNTED FAULT DETECTORS

(71) Applicant: Schweitzer Engineering Laboratories, Inc., Pullman, WA (US)

(72) Inventors: Daniel B. Rippon, Pullman, WA (US); Raymond W. Rice, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 50 days.

(21) Appl. No.: 15/944,966

(22) Filed: Apr. 4, 2018

(51) Int. Cl.
G01R 31/08 (2006.01)
G01R 1/20 (2006.01)
H02H 9/00 (2006.01)
H02H 1/00 (2006.01)
H02N 99/00 (2006.01)

(52) U.S. Cl.
CPC .......... G01R 31/085 (2013.01); G01R 1/206 (2013.01); H02H 1/0007 (2013.01); H02H 9/005 (2013.01); H02N 99/00 (2013.01)

(58) Field of Classification Search
CPC .................................................. G01R 31/085
See application file for complete search history.

(56) References Cited

U.S. PATENT DOCUMENTS

| | | | |
|---|---|---|---|
| 3,239,678 A | 3/1966 | Kolm | |
| 5,068,811 A * | 11/1991 | Johnston | B03C 3/68 323/241 |
| 5,293,323 A | 3/1994 | Doskocil | |
| 5,465,399 A | 11/1995 | Oberholtzer | |
| 5,608,306 A | 3/1997 | Rybeck | |
| 5,726,644 A | 3/1998 | Jednacz | |
| 5,861,684 A | 1/1999 | Slade | |

(Continued)

FOREIGN PATENT DOCUMENTS

| WO | 2009009453 | 1/2009 |
|---|---|---|
| WO | 2009088652 | 7/2009 |

(Continued)

OTHER PUBLICATIONS

Cymbel Corporation, "Permanent Power for Wireless Sensors" 2008.

(Continued)

*Primary Examiner* — Noam Reisner
(74) *Attorney, Agent, or Firm* — Jared L. Cherry

(57) ABSTRACT

The present disclosure pertains to systems and methods for reducing startup times of line-mounted fault detectors. A line-mounted fault detector may comprise a power harvesting subsystem and an energy storage subsystem configured to store electrical energy. A fast-start power coupling subsystem may receive power from the energy storage subsystem in a startup state and provide power to a subset of components. A DC-DC converter subsystem may start up after a voltage of the energy storage subsystem exceeds a threshold. A control subsystem may transition the line-mounted fault detector to an operating state once the DC-DC converter has started and may de-energize the fast-start power coupling subsystem. The control system may enable a flow of electrical energy from the DC-DC converter to the fast-start subsystem. A fault detection subsystem in electrical communication with the DC-DC converter subsystem may communicate an indication of a fault via an RF transmitter subsystem.

20 Claims, 7 Drawing Sheets

(56) References Cited

U.S. PATENT DOCUMENTS

| | | |
|---|---|---|
| 6,029,074 A | 2/2000 | Irvin |
| 6,304,176 B1 | 10/2001 | Discenzo |
| 6,492,910 B1 | 12/2002 | Ragle |
| 6,657,418 B2 | 12/2003 | Atherton |
| 6,816,439 B1 | 11/2004 | Kawahara |
| 6,894,478 B1 | 5/2005 | Fenske |
| 7,060,379 B2 | 6/2006 | Speranza |
| 7,103,786 B2 | 9/2006 | Chen |
| 7,132,763 B2 | 11/2006 | Rendic |
| 7,170,194 B2 | 1/2007 | Korcharz |
| 7,274,168 B2 | 9/2007 | Tskukamoto |
| 7,315,169 B1 | 1/2008 | Fenske |
| 7,382,272 B2 | 3/2008 | Feight |
| 7,339,353 B1 | 4/2008 | Masias |
| 7,369,950 B2 | 5/2008 | Wall |
| 7,385,374 B2 | 6/2008 | Frantz |
| 7,398,101 B2 | 7/2008 | Zinn |
| 7,411,371 B2 | 8/2008 | Hobbs |
| 7,667,482 B2 | 2/2010 | Mort |
| 7,948,352 B2 | 5/2011 | Tang |
| 7,983,230 B1 | 7/2011 | Li |
| 8,103,463 B2 | 1/2012 | Kalgren |
| 8,650,411 B2 | 2/2014 | Feight |
| 8,665,102 B2 | 3/2014 | Salewske |
| 9,386,529 B2 | 7/2016 | Swartzendruber |
| 2001/0054878 A1 | 12/2001 | Odaohhara |
| 2003/0020332 A1 | 1/2003 | Giannopoulos |
| 2003/0111908 A1 | 6/2003 | Christensen |
| 2004/0036359 A1 | 2/2004 | Griffith |
| 2004/0078606 A1 | 4/2004 | Chen |
| 2004/0256915 A1 | 12/2004 | Phinney |
| 2005/0006956 A1 | 1/2005 | Shi |
| 2005/0253560 A1 | 11/2005 | Popescu-Stanesti |
| 2007/0269219 A1 | 11/2007 | Teller |
| 2008/0122518 A1 | 5/2008 | Besser |
| 2008/0174278 A1 | 7/2008 | Masias |
| 2008/0287082 A1 | 11/2008 | Govindswamy |
| 2009/0243796 A1 | 10/2009 | Tieman |
| 2010/0013632 A1 | 1/2010 | Salewske |
| 2011/0001485 A1 | 1/2011 | Feight |
| 2013/0301683 A1 | 11/2013 | Sinsuan |
| 2016/0352214 A1* | 12/2016 | Young .............. H02M 7/06 |

FOREIGN PATENT DOCUMENTS

| | | |
|---|---|---|
| WO | 2010020833 | 2/2010 |
| WO | 2010027343 | 3/2010 |

OTHER PUBLICATIONS

Atmel Corporation "Power Management Using the Embedded Stand-alone Wake-up Mode Protocol. Rev. 2" 2002.

Fisher Pierce "Radio Faulted Circuit Indicator System" 1999.

University of Michigan, University of Michigan News Service, Michroship sets low-power record with extreme sleep mode, 39612, http://www.ns.umich.edu/htdocs/releases/print.php?htdocs/releases/plainstory.php?id=661 . . . , Jun. 2008.

Jeffrey L. Barlow, "Characterizing Dynamic Power and Data Rate Policies for Wireless Networks" Department of Computer Science, Brigham Young University, Aug. 2006.

* cited by examiner

SYSTEM TO REDUCE START-UP TIMES IN LINE-MOUNTED FAULT DETECTORS

TECHNICAL FIELD

The present disclosure relates to systems and methods for reducing the start-up time for electrical devices. More specifically, but not exclusively, the present disclosure describes fast-start circuitry designed to initially power certain components within line-mounted devices to decrease the overall startup time of such devices.

BRIEF DESCRIPTION OF THE DRAWINGS

Non-limiting and non-exhaustive embodiments of the disclosure are described, including various embodiments of the disclosure, with reference to the figures, in which.

DETAILED DESCRIPTION

Figure 1:
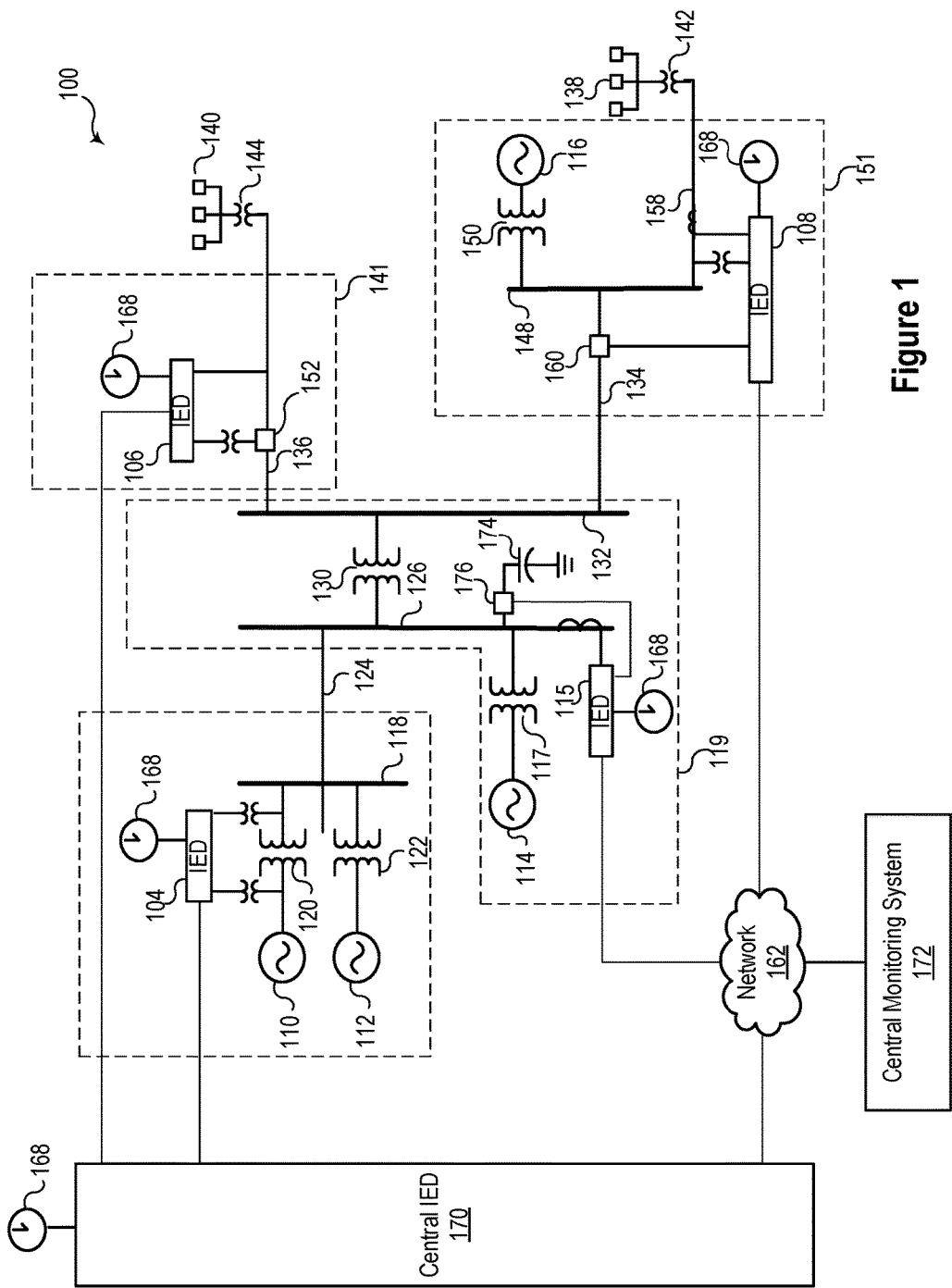
FIG. 1 illustrates an example of a simplified one-line diagram of an electric power transmission and distribution system in which a plurality of line-mounted communication devices may be used consistent with embodiments of the present disclosure.

Modern electric power systems may incorporate a variety of communication technologies to monitor and protect the system. The system may utilize the communication equipment to facilitate an exchange of data among a variety of devices that monitor conditions on the power system and implement control actions to maintain the stability of the power system. The communication networks carry information useful for the proper assessment of power system conditions and for implementing control actions based on such conditions. In addition, such messages may be subject to time constraints because of the potential for rapid changes in conditions in an electric power transmission and distribution system.

A plurality of devices may be placed throughout an electric power system to detect faults, outages, and other conditions affecting the system. Some monitoring devices may harvest power from a power line to which the device is attached. Such devices may monitor various electrical parameters associated with the power line to which the device is attached and communicate information relating to electrical parameters in the power line. In some embodiments, information collected by such devices may be wirelessly transmitted to a monitoring system configured to maintain the stability of the power system.

If a fault occurs on the electrical line when a line-mounted fault detector is de-energized, the time needed to transmit a fault message depends on the start-up time of the device. The startup time of the device depends on the device's ability to harvest sufficient energy to make the transmission, and the startup time of internal components. The internal components of the line-mounted fault detector may have different startup times and power requirements. For example, many line-mounted devices incorporate a DC-DC converter. DC-DC converters both draw a large inrush current and tend to operate more efficiently at higher voltages. Accordingly, it may be advantageous to temporarily bypass the DC-DC converter while a supply voltage ramps up. During this ramp-up period, certain fast-start components may be more directly powered from power harvested from the power line to reduce the overall startup time of the device. In some embodiments, the fast-start components may comprise components of an RF transmission system, such as a crystal oscillator and phase-lock-loop (PLL) that requires a particular time to lock.

The present disclosure may be particularly useful for detecting faults during a reclose operation. In a reclose operation, a portion of the power system may be de-energized upon the detection of a fault. The de-energized portion may be re-energized after a relatively short period of time (e.g., a matter of seconds) to determine if the cause of the fault condition has abated. If the cause of the fault condition persists, a control system may de-energize the portion of the power system as soon as possible; however, line-mounted devices may introduce a delay as they start up before communicating whether a fault current is detected. Reducing the amount of time from re-energization to transmission of a signal may therefore reduce the amount of time that an electric power system is subjected to a fault condition. Fault conditions may damage equipment associated with the electric power system, or other property, and may create unsafe conditions.

Although several embodiments disclosed herein pertain to line-mounted sensors in electric power systems, a variety of devices may incorporate fast-start elements consistent with the present disclosure. A line-mounted device, as the term is used herein, includes any device configured to harvest power from a power line in an electrical power system. In addition to line-mounted fault sensors, a variety of communication devices may also harvest power from an electrical line or other power sources. A communication device, as the term is used herein, includes any device that is capable of generating and/or accepting and forwarding data traffic in a data communication network. In addition to the functionality of generating and/or accepting and forwarding data traffic, communication devices may also perform a wide variety of other functions and may range from simple to complex devices. In some embodiments, power sources may include a thermal power source, a photovoltaic power source, a piezoelectric power source, and the like.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates an example of an embodiment of a simplified one-line diagram of an electric power transmission and distribution system 100. Electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 142, 144 and 150), power transmission and distribution lines (e.g., lines 124, 134, 136, and 158), circuit breakers (e.g., breakers 152, 160, 176), busses (e.g., busses 118, 126, 132, and 148), loads (e.g., loads 140, and 138) and the like. A variety of other types of equipment may also be included in electric power delivery system 100, such as voltage regulators, capacitor banks, and a variety of other types of equipment.

Substation 119 may include a generator 114, which may be a distributed generator, and which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further step-down transformer 144 in communication with distribution bus 132 via distribution line 136 may be used to step down a voltage for consumption by load 140.

Distribution line 134 may lead to substation 151 and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. In general, IEDs in an electric power system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

A common time signal may be distributed throughout system 100. Utilizing a common or universal time source may ensure that IEDs have a synchronized time signal that can be used to generate time-synchronized data, such as synchrophasors. In various embodiments, IEDs 104, 106, 108, 115, and 170 may receive a common time signal 168. The time signal may be distributed in system 100 using a communications network 162 or using a common time source, such as a Global Navigation Satellite System ("GNSS"), or the like.

According to various embodiments, central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

Communication via network 162 may be facilitated by networking devices including, but not limited to, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multi-function hardware (e.g., processors, computer-readable storage media, communications interfaces, etc.) that can be utilized in order to perform a variety of tasks that pertain to network communications and/or to operation of equipment within system 100.

A plurality of devices may be disposed throughout system 100 to monitor electrical conditions and communicate such conditions to IEDs 104, 106, 108, and 115. Information regarding electrical conditions may provide information used by IEDs 104, 106, 108, 115, and/or 170 to implement control actions to maintain the stability and safety of system 100. In one specific embodiment, a plurality of line-mounted devices may be disposed on transmission lines 124 and 134. These line-mounted devices may be configured to detect over-current conditions. In response to detection of an over-current condition, the line-mounted devices may transmit a signal to one or more IEDs in system 100. The IEDs may interrupt the flow of electrical current to clear the overcurrent condition. The IED may further implement a reclose operation in a relatively short span of time to determine if the cause of the overcurrent condition has abated. If the cause of the overcurrent condition has not abated, minimizing the time from the reclose operation to transmission of an indication of the continuing overcurrent condition is desirable to avoid damage to system 100 and potentially unsafe conditions (e.g., arching). The systems and methods disclosed herein may reduce the startup time of the line-mounted sensors.

Figure 2:
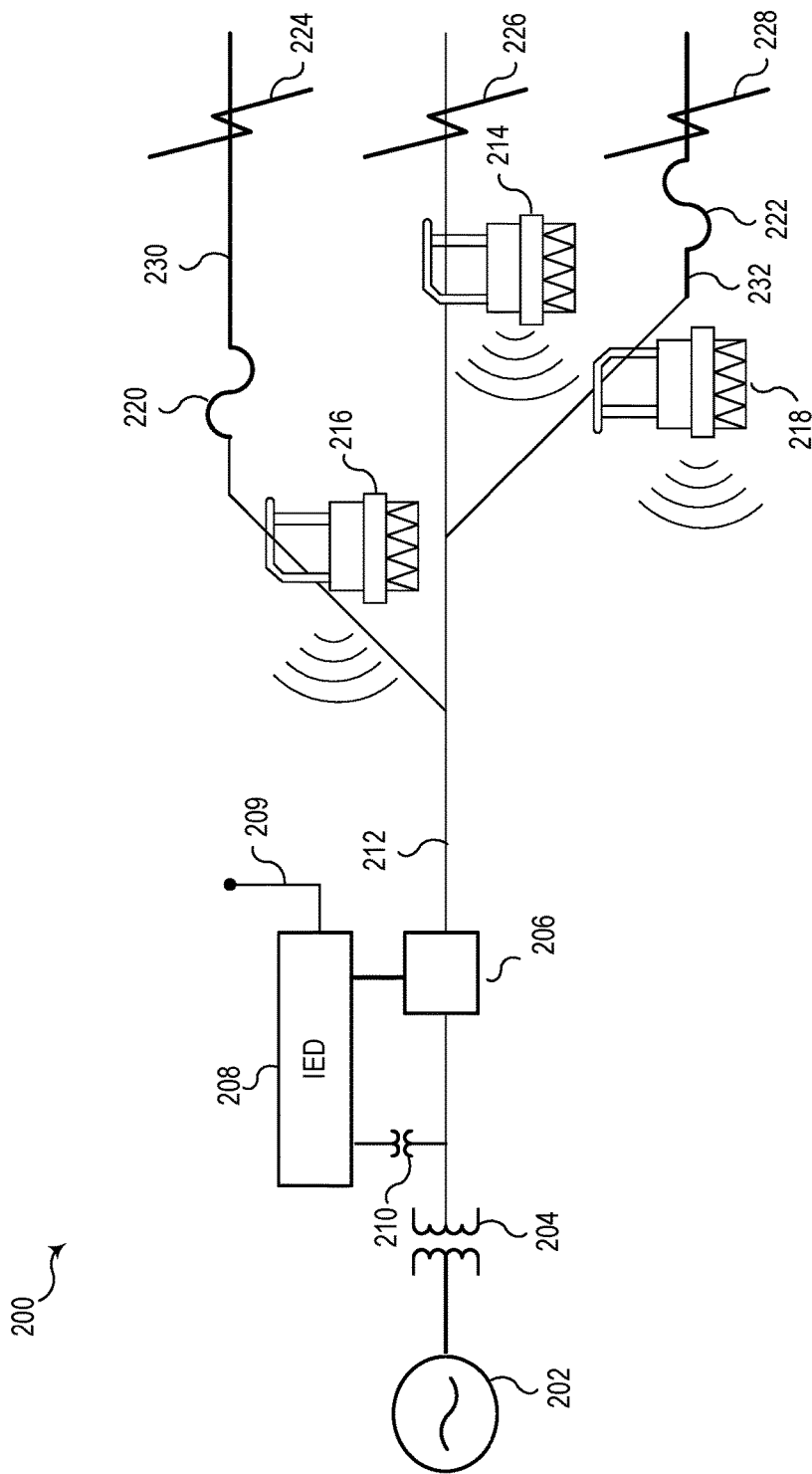
FIG. 2 illustrates a simplified one-line diagram of an electric power system including a main line and a plurality of distribution feeders monitored by line-mounted fault detectors consistent with embodiments of the present disclosure.

FIG. 2 illustrates a simplified one-line diagram of an electric power system 200 including a main line 212 and a plurality distribution feeders 230, 232 monitored by line-mounted fault detectors 214, 216, and 218, respectively, consistent with embodiments of the present disclosure. A generator 202 may generate electricity. The voltage may be increased by a transformer 204 to a level suitable for transmission. An IED 208 may monitor voltage on main line 212 via a transformer 210. IED 208 may control a breaker 206 operable to interrupt the flow of electrical current through main line 212. IED 208 may include a wireless receiver 209 configured to wirelessly receive signals from line-mounted fault detectors 214, 216, and 218.

Main line 212 and distribution feeders 230 and 232 each have a line-mounted fault detector 214, 216, and 218, respectively, to detect an overcurrent condition. Line-mounted fault detectors 214, 216, and 218 may wirelessly transmit signals to IED 208 upon detection of a fault condition. In some embodiments, line-mounted fault detectors 214, 216, and 218 may detect the fault condition based on the flow of current through the line. In one specific embodiment, line-mounted fault detectors 214, 216, and 218 may be embodied using SEL-FT50 line-mounted fault detectors, available from Schweitzer Engineering Laboratories of Pullman, Wash.

Line-mounted fault detectors 214, 216, and 218 may harvest power from the electrical conductor to which each device is mounted. Line-mounted fault detectors 214, 216, and 218 may be designed to operate with little or no maintenance. As such, the devices may be designed to operate without components that may require maintenance or replacement, such as batteries. Accordingly, when main line 212 or distribution feeders 230, 232 are de-energized, line-mounted fault detectors 214, 216, and 218 may also be de-energized. When electrical power is restored, line-mounted fault detectors 214, 216, and 218 may start up from the de-energized state. While starting up, line-mounted fault detectors 214, 216, and 218 may be unable to transmit indications of fault conditions. Accordingly, it is desirable to minimize the startup times of line-mounted fault detectors 214, 216, and 218 to reduce the amount of time that system 200 is subjected to fault conditions.

Placement of line-mounted fault detectors 214, 216, and 218 on main line 212 and distribution feeders 230, 232 may allow for a variety of approaches based on where the fault is located. Such flexibility may improve reliability of system 200 by allowing fuse-saving and fuse-blowing schemes on a particular distribution feeder. For example, if a fault 224 occurs on distribution feeder 230, a fuse 220 may be allowed to blow, thus allowing service to continue on main line 212 and distribution feeder 232 while the conditions causing fault 224 are remedied. In another example, if a fault 228 occurs on distribution feeder 232, IED 208 may be configured to implement a fuse-saving strategy, and accordingly, may actuate breaker 206 to interrupt the flow of electrical current to main line 212. In a final example, if a fault 226 occurs on main line 212, IED 208 may immediately actuate breaker 206, because main line 212 is unfused.

Line-mounted fault detectors 214, 216, and 218 provide information about the line on which a fault occurs, thus allowing an operator to tailor the response of system 200 based on the location of a fault. In order to achieve this benefit, however, line-mounted fault detectors 214, 216, and 218, may be able to startup, detect a fault condition, and transmit an indication of a fault condition before the fault condition causes fuses 220 or 222 to blow. For example, in the case of a fuse-saving strategy associated with distribution feeder 232, line-mounted fault detector 218 must start up and transmit an indication of a fault condition in less time than is required for fault 228 to cause fuse 222 to blow. If line-mounted fault detector 218 fails to start up in less time than is required for fault 228 to cause fuse 222 to blow, the fuse-saving strategy would be ineffective.

Figure 3A:
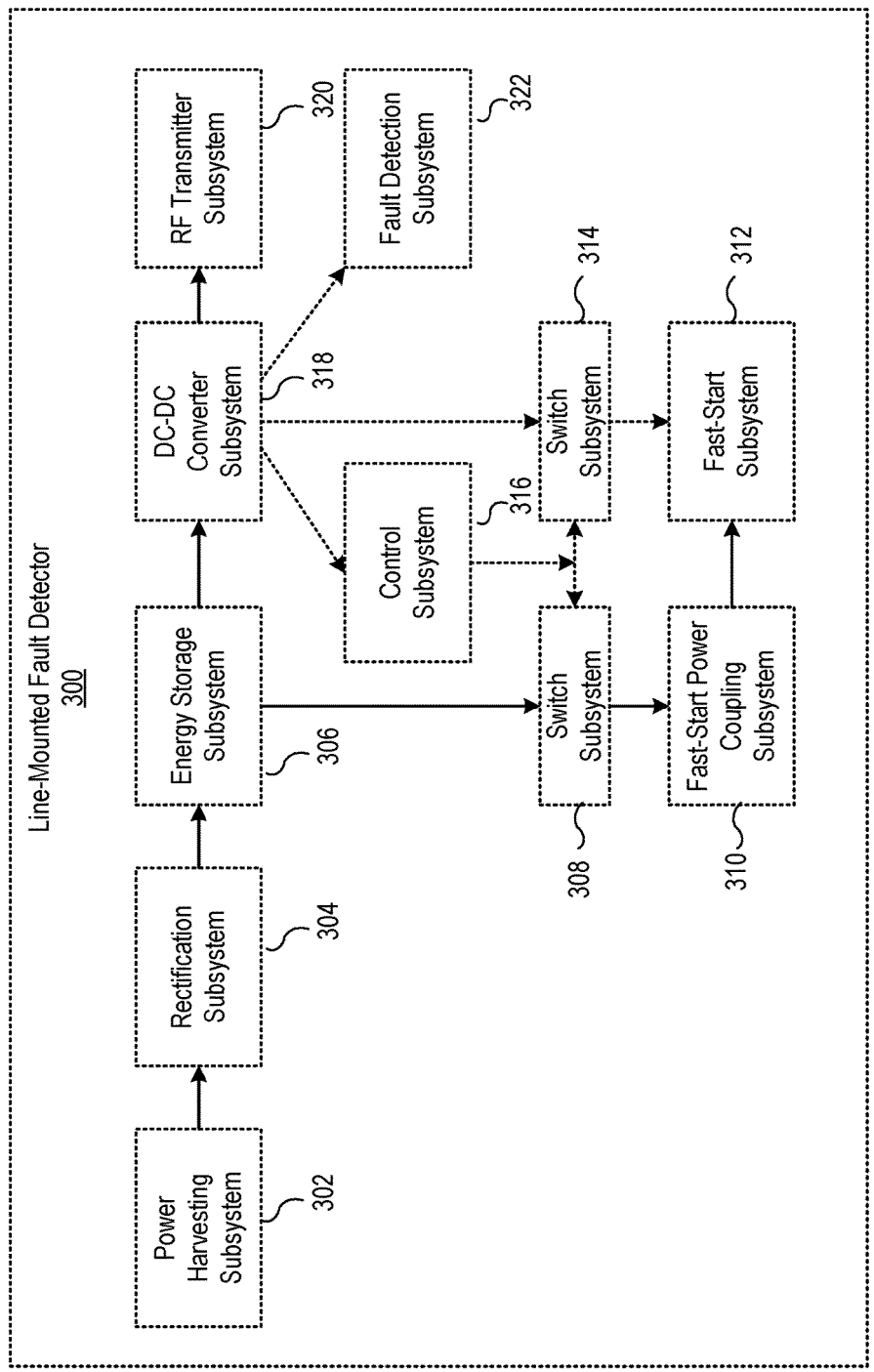
FIG. 3A illustrates a functional block diagram of a line-mounted fault detector in an unpowered state consistent with embodiments of the present disclosure.

FIG. 3A illustrates a functional block diagram of a line-mounted fault detector 300 in an unpowered state consistent with embodiments of the present disclosure. Since the device illustrated is in an unpowered state, all components are unpowered, as indicated by dashed lines. Solid lines connecting various components may indicate a path for the flow of electrical energy at startup, while dashed lines indicate that power does not flow through a particular path.

Line-mounted fault detector 300 may harvest power from a power line using power harvesting subsystem 302. The output of the power harvesting subsystem 302 may be rectified by rectification subsystem 304. This energy is then stored in energy storage subsystem 306. In certain embodiments, energy storage subsystem 306 may comprise capacitors that begin to accumulate charge once the power harvesting subsystem 302 begins harvesting power. Energy storage subsystem 306 may be connected to a switch subsystem 308 that selectively enables and disables fast-start power coupling subsystem 310.

The fast-start power coupling subsystem 310 may provide power to a fast-start subsystem 312. In various embodiments, the fast-start subsystem 312 may include devices that both may tolerate the loosely regulated voltage provided by the fast-start power coupling subsystem 310 and that may have a longer startup time or otherwise increase delay before line-mounted fault detector 300 is ready to transmit. In some embodiments, the fast-start subsystem 312 may comprise an oscillator and a PLL associated with an RF transmitter.

Control subsystem 316 may control switch subsystems 308 and 314 to selectively enable and disable the fast-start power coupling subsystem 310. In the de-energized state shown in FIG. 3A, the control subsystem 316 may be inactive. When the DC-DC converter subsystem 318 is powered, the control subsystem 316 may activate and trigger switch subsystems 308 and 314. More specifically, upon activation, the control subsystem 316 may configure switch subsystems 308 and 314 to transition from supplying electrical energy to the fast-start subsystem 312 from the fast-start power coupling subsystem 310 to supplying electrical energy from the DC-DC converter subsystem 318. Switches 308 and 314 may control the power flow from both power sources by way of an electrical switch such as a low-resistance MOSFET, diode, or a relay. The fast-start power coupling subsystem 310 may be disabled once the DC-DC converter subsystem 318 has started up. DC-DC converter subsystem 318 may power fast-start subsystem 312, control subsystem 316, an RF transmitter subsystem 320, and a fault detection subsystem following startup. RF transmitter subsystem 320 may be configured to wirelessly transmit an indication of a fault detected by fault detection subsystem 322.

Figure 3B:
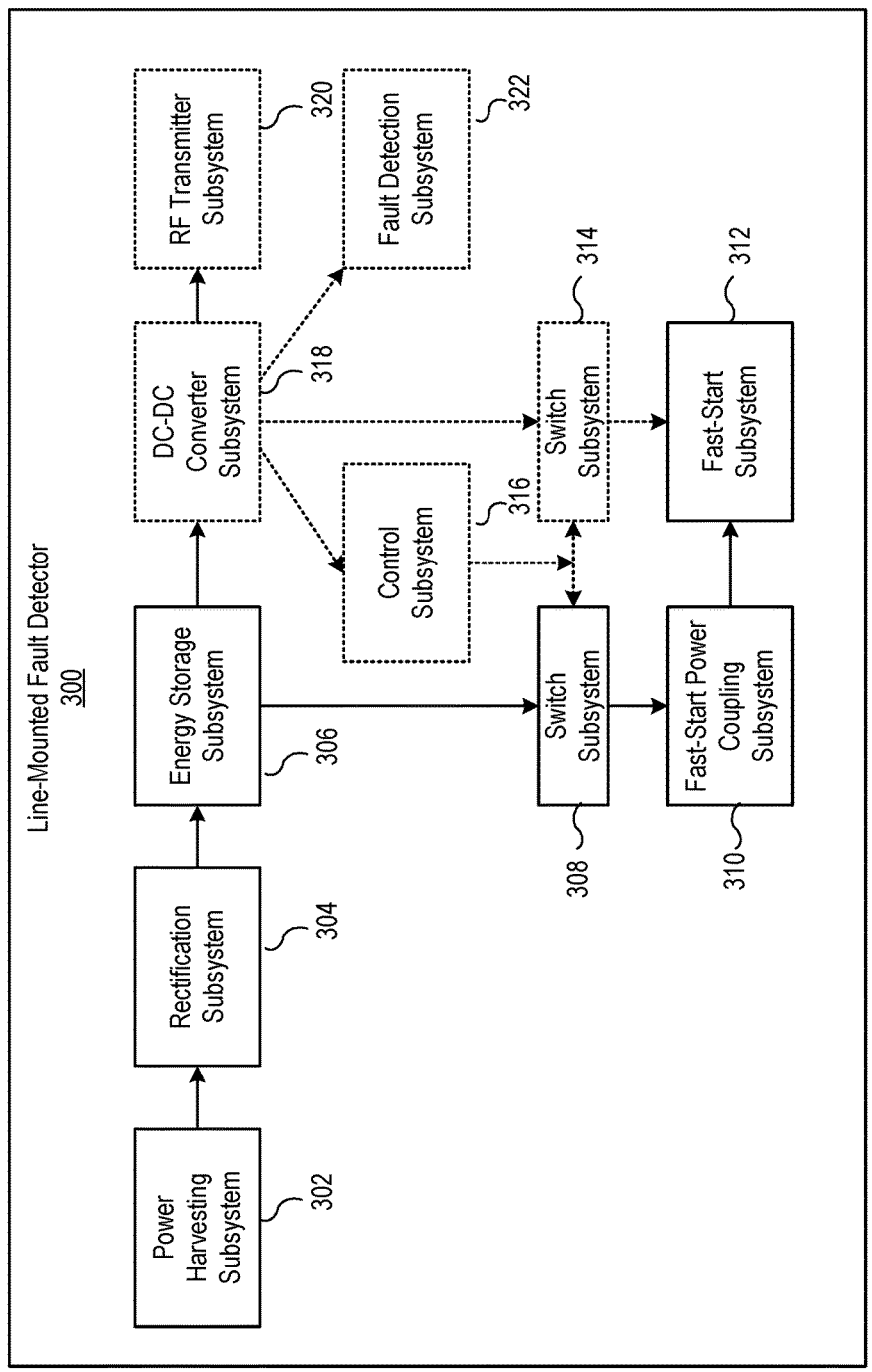
FIG. 3B illustrates the line-mounted fault detector of FIG. 3A in a startup state following energization of a power line on which the line-mounted fault detector is mounted consistent with embodiments of the present disclosure.

FIG. 3B illustrates line-mounted fault detector 300 in a startup state following energization of a power line on which the line-mounted fault detector 300 is mounted consistent with embodiments of the present disclosure. In some embodiments, line-mounted fault detector 300 may remain in the startup state while the input voltage is between about 1 volt to about 50 volts. In certain embodiments, the time to power on may be on the order of approximately 5 milliseconds.

As the line is energized on which line-mounted fault detector 300 is mounted, power harvesting subsystem 302 begins to supply power to the rectification subsystem 304, which in turn supplies power to energy storage subsystem 306. Energy storage subsystem 306 may supply electric power via switch subsystem 308 to fast-start power coupling subsystem 310. The components of fast-start subsystem 312 may begin to start up although DC-DC converter subsystem 318, control subsystem 316, and RF transmitter subsystem 320 remain unpowered.

As previously described, fast-start subsystem 312 may comprise elements that require a longer startup time. In certain embodiments, the fast-startup subsystem 312 may include a crystal oscillator and PLL used by a wireless transmitter. The PLL may require a period of time to lock and generate a stable output suitable for use by a wireless transmitter.

Figure 3C:
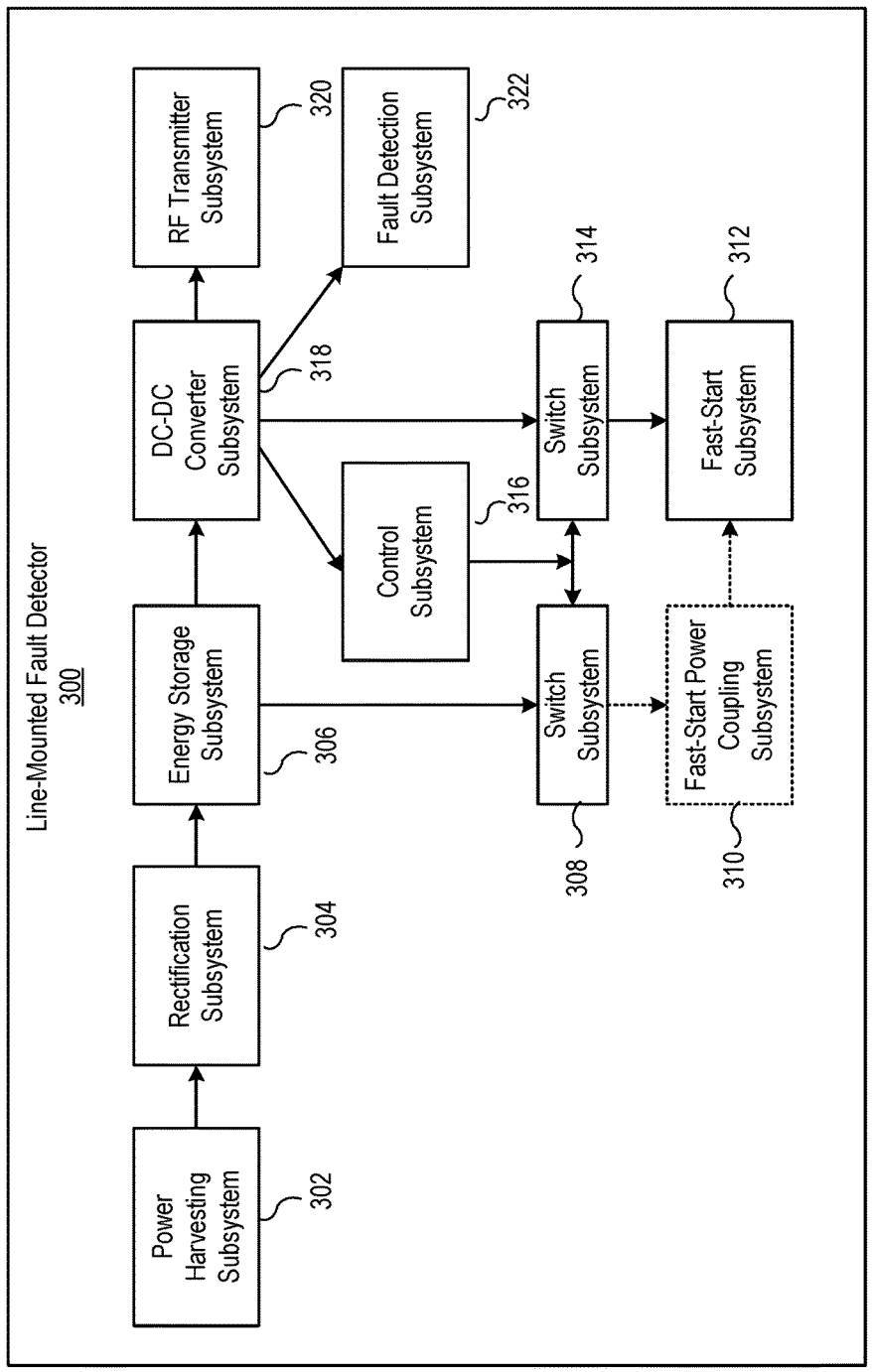
FIG. 3C illustrates the line-mounted fault detector of FIG. 3A in an operating state consistent with embodiments of the present disclosure.

FIG. 3C illustrates line-mounted fault detector 300 in an operating state consistent with embodiments of the present disclosure. In the illustrated state, DC-DC converter subsystem 318 is energized and provides power to control subsystem 316, which may configure switch subsystem 308. Switch 308 may be configured to disable the flow of electric energy from energy storage subsystem 306 to fast-start power coupling subsystem 310, while switch subsystem 314 is configured to enable the flow of electric energy from DC-DC converter subsystem 318 to fast-start subsystem 312. In addition, electric energy may be provided to RF transmitter subsystem 320. In various embodiments, RF transmitter subsystem 320 and fault detection subsystem 322 may be energized and activated once DC-DC converter subsystem 318 is active. Upon detection of a fault by fault detection subsystem 322, an indication of the fault may be communicated by RF transmitter subsystem 320.

Figure 4:
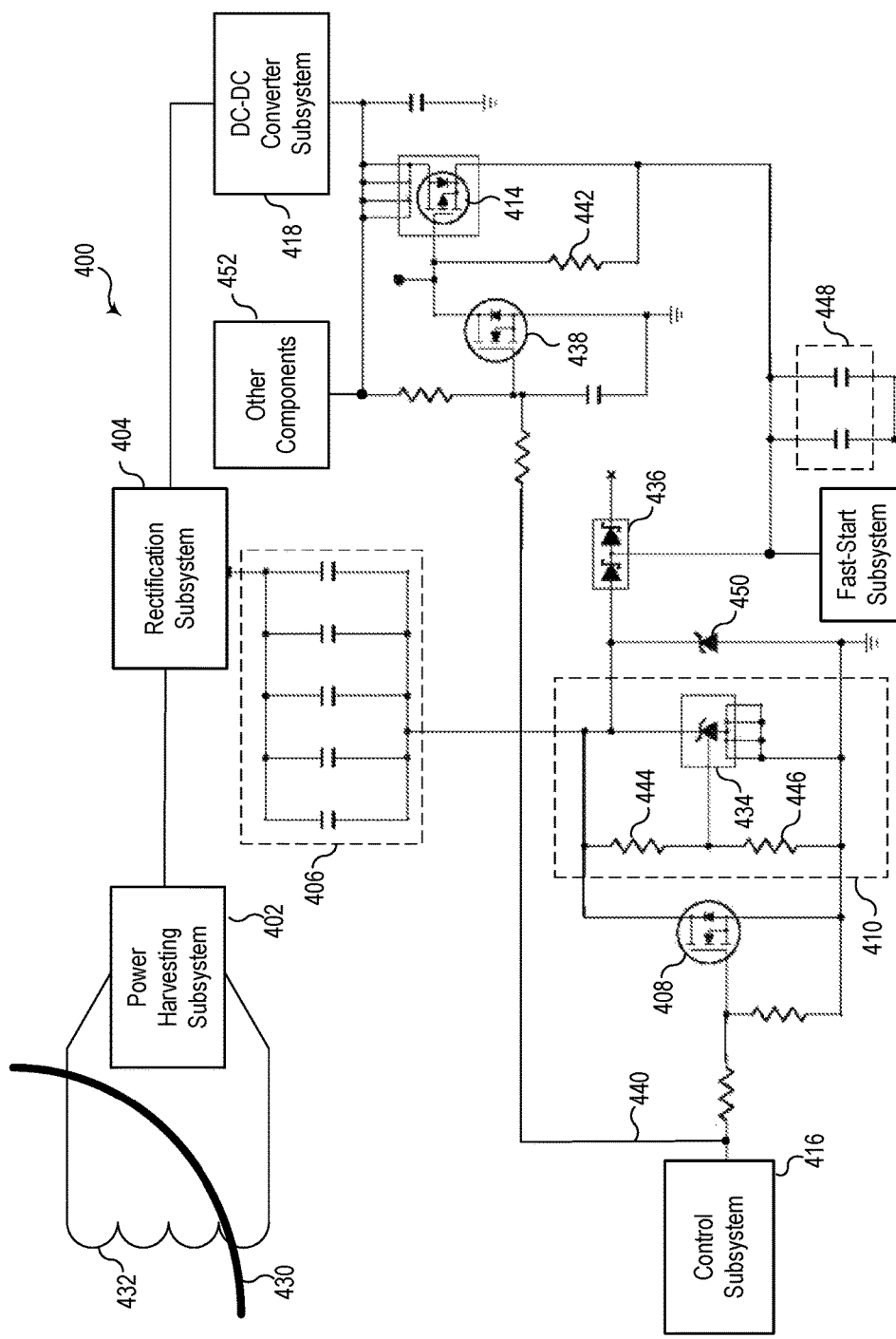
FIG. 4 illustrates a partial circuit diagram of a line-mounted fault detector consistent with embodiments of the present disclosure.

FIG. 4 illustrates a partial circuit diagram of a line-mounted fault detector 400 consistent with embodiments of the present disclosure. A power harvesting subsystem 402 may comprise an inductor 432 disposed in proximity to an electric conductor 430 and configured to harvest electric energy therefrom through inductive coupling. The harvested electrical energy may be rectified by rectification subsystem 404. An energy storage subsystem 406 may comprise a plurality of capacitors that store the harvested and rectified electric energy. A DC-DC converter subsystem 418 may also receive harvested energy, but as discussed above, DC-DC converter subsystem 418 may not start up until the voltage of an output of energy storage subsystem 406 exceeds a threshold. Power harvesting from conductor 430 is more efficient using a higher voltage on energy storage subsystem 406 because the power harvesting subsystem 402 approximates a current source, so higher voltages produce more power.

A shunt regulator 434 may be used to bias the negative leg of energy storage subsystem 406. In the illustrated embodiment, the shunt regulator 434 may be coupled to a voltage divider created by resistors 444 and 446. In one specific embodiment, the bias voltage mage be approximately 3.5V-4.0V. The bias voltage created by shunt regulator 434 is coupled to diode 436 and generates a voltage across capacitors 448. In one embodiment, the voltage created across capacitors 448 may be approximately 3.0 V, and may be used to power a fast-start subsystem 412. Shunt regulator 434 and resistors 444 and 446 may comprise one specific embodiment of a fast-start power coupling subsystem 410.

Once DC-DC converter subsystem 418 starts up, control subsystem 416 may assert a control signal 440 to cause the output of the DC-DC converter subsystem 418 to be connected to the positive leg of capacitors 448. The control signal 440 asserted by control subsystem 416 turns on transistor 414 (via inversion through transistor 438), and transistor 408. Turning on transistor 408 brings the negative leg of the energy storage subsystem 406 very close to ground potential, thus reducing additional power consumption.

Turning on transistor 414 creates a low impedance connection to the output of DC-DC converter subsystem 418. The gate of transistor 414 is connected such that electric energy does not flow through transistor 414 until the control signal 440 is asserted (i.e., when fast-start power coupling subsystem 410 is energized and DC-DC converter subsystem 418 is de-energized). In the illustrated embodiment, transistor 414 is embodied as a P-Channel MOSFET with its gate connected to its source through a high-value resistor 442. This configuration prevents transistor 414 from conducting while system 400 is initially powering on, and accordingly, fast-start coupling system 410 does not provide power to other components 452 of system 400. In various embodiments, other components 452 may comprise digital logic, operational amplifiers, comparators, oscillators, timers, EEPROMs, control switches, RF transmitters, and other components.

A transient-voltage-suppression (TVS) subsystem may be used to protect against large transient currents. In the illustrated embodiment, the transient voltage-suppression subsystem may be embodied as a diode 450. In the illustrated embodiment, diode 450 comprises a Zener-diode. When the reverse voltage on diode 450 exceeds a critical reverse voltage, a large reverse current can flow.

A variety of changes may be made to the specific embodiment illustrated in FIG. 4. For example, in other embodiments, fast-start power coupling subsystem 410 may be implemented using a linear regulator, switched capacitor regulator, or a second buck regulator instead of shunt regulator 434. A variety of other changes may similarly be implemented in connection with any of the other illustrated components.

Figure 5:
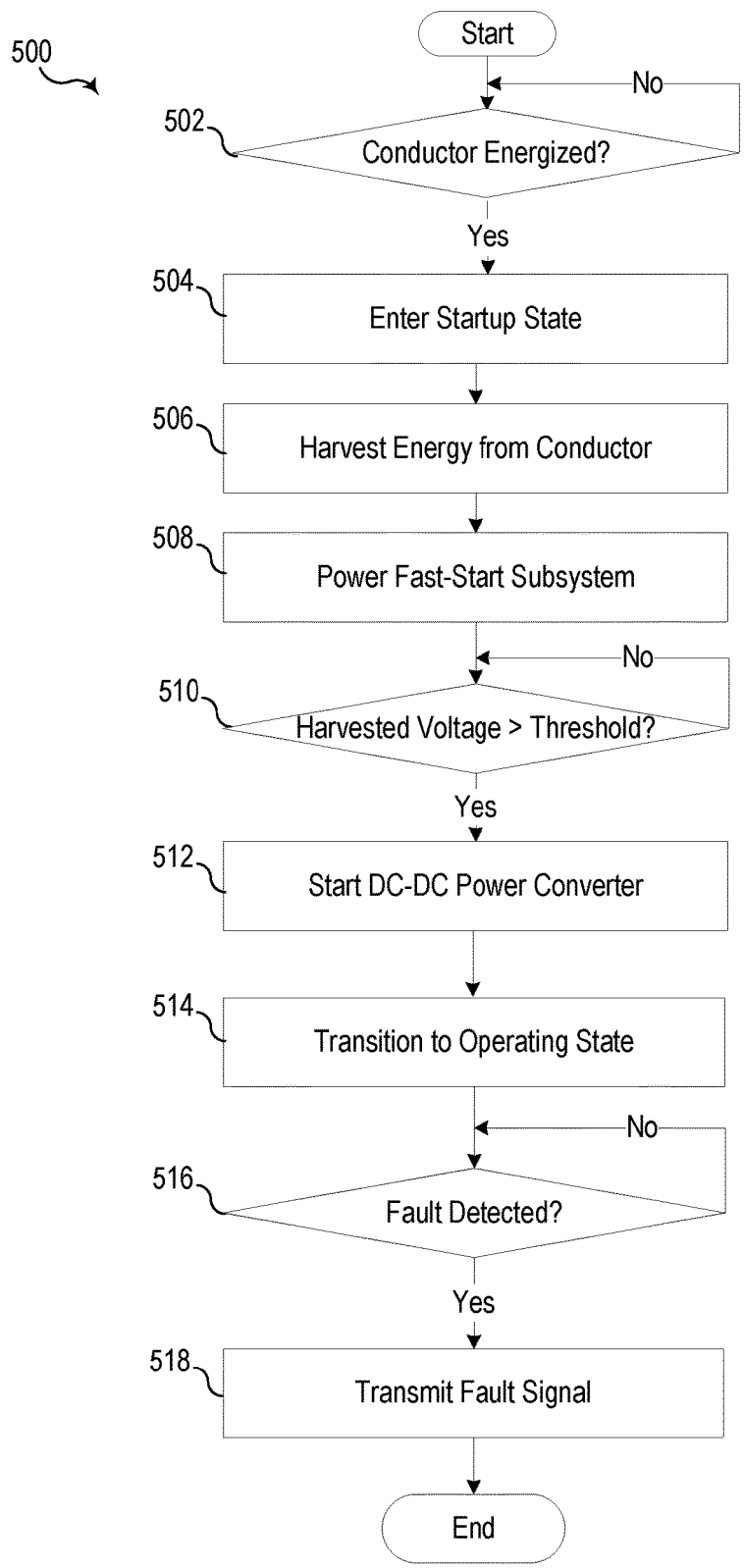
FIG. 5 illustrates a flow chart of a method for reducing startup time in a line-mounted fault detector using a fast-start subsystem consistent with embodiments of the present disclosure.

FIG. 5 illustrates a flow chart of a method for reducing startup time in a line-mounted fault detector using a fast-start subsystem consistent with embodiments of the present disclosure. Method 500 may begin when a conductor on which a line-mounted fault detector is mounted is de-energized. Method 500 may remain at 502 until the conductor is energized. At 502, the line-mounted fault detector may enter a startup state 504, in which certain components are powered by a fast-start power coupling subsystem. At 506, energy may be harvested from the conductor to which the line-mounted fault detector is coupled and used to power a fast-start subsystem at 508. In various embodiments, the fast-start subsystem may be powered by an energy storage subsystem.

At 510, method 500 may determine whether the harvested voltage is greater than a threshold. A DC-DC converter subsystem may draw a large inrush current and tend to operate more efficiently at higher voltages. Accordingly, the DC-DC converter subsystem may not be started until voltage on the energy storage subsystem exceeds the threshold. In some embodiments, the threshold may range between 1 volt and 50 volts. Method 500 may remain at 510 until the voltage exceeds the threshold.

At 512, the DC-DC power converter may be started. Following the startup of the DC-DC power converter, the line-mounted fault detector may transition to an operating state at 514. In the operating state, the line-mounted fault detector may be powered by the DC-DC power converter. In the operating state, the fast-start power coupling subsystem may be de-energized.

At 516, line-mounted fault detector may determine whether a fault is detected. In various embodiments, the line-mounted fault detector may be configured to detect an over-current condition. Upon detection of a fault, a fault signal may be transmitted at 518. In various embodiments, the fault signal may be transmitted using an RF transmitter.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A line-mounted fault detector, comprising:
   a power harvesting subsystem configured to harvest electrical energy from a conductor in an electric power system;
   a rectification subsystem configured to rectify electrical energy harvested by the power harvesting subsystem;
   an energy storage subsystem configured to store electrical energy rectified by the rectification subsystem;
   a fast-start power coupling subsystem;
   a first switch subsystem configured to selectively provide electrical energy to the fast-start power coupling subsystem;
   a fast-start subsystem configured to provide power to a subset of components in a startup state;
   a DC-DC converter subsystem in electrical communication with the energy storage subsystem and configured to start up after a voltage of the energy storage subsystem exceeds a first threshold, the DC-DC converter subsystem configured to generate a DC output from electrical energy received from the energy storage subsystem;
   a second switch subsystem configured to selectively provide electrical energy from the DC-DC converter to the fast-start subsystem;
   a control subsystem configured to transition the line-mounted fault detector to an operating state and to:
      actuate the first switch subsystem after an output of the DC-DC converter exceeds a second threshold, the first switch subsystem configured to de-energize the fast-start power coupling subsystem, and
      actuate the second switch subsystem after the output of the DC-DC converter exceeds the second threshold, the second switch subsystem configured to enable a flow of electrical energy from the DC-DC converter to the fast-start subsystem;
   a fault detection subsystem in electrical communication with the DC-DC converter subsystem and configured to detect a fault condition;
   an RF transmitter subsystem in electrical communication with the DC-DC converter subsystem and configured to transmit an indication of the fault condition.

2. The line-mounted fault detector of claim 1, wherein the fast-start subsystem comprises a crystal oscillator and a phase-lock loop configured to generate a reference frequency for use by the RF transmitter subsystem.

3. The line-mounted fault detector of claim 1, wherein the power harvesting subsystem is configured to harvest power from the electrical conductor via inductive coupling.

4. The line-mounted fault detector of claim 1, wherein the fault detection subsystem comprises an over-current detector.

5. The line-mounted fault detector of claim 1, wherein one of the first switch subsystem and the second switch subsystem comprise a solid-state switch.

6. The line-mounted fault detector of claim 1, wherein the energy storage subsystem comprises a plurality of capacitors.

7. The line-mounted fault detector of claim 1, further comprising a transient-voltage-suppression subsystem.

8. A system, comprising:
   a power harvesting subsystem configured to harvest electrical energy from a power source;

an energy storage subsystem configured to store electrical energy harvested by the power harvesting subsystem;

a fast-start power coupling subsystem configured to receive power from the energy storage subsystem in a startup state and to provide power to a subset of components in the startup state;

a DC-DC converter subsystem in electrical communication with the energy storage subsystem and configured to start up after an output of the energy storage subsystem exceeds a threshold, the DC-DC converter subsystem configured to generate a DC output from electrical energy received from the energy storage subsystem;

a control subsystem configured to transition the system to an operating state and to de-energize the fast-start power coupling subsystem and to enable a flow of electrical energy from the DC-DC converter subsystem to the fast-start subsystem;

an RF transmitter subsystem in electrical communication with the DC-DC converter subsystem and configured to transmit a signal.

9. The system of claim 8, wherein the fast-start subsystem comprises a crystal oscillator and a phase-lock loop configured to generate a reference frequency for use by the RF transmitter subsystem.

10. The system of claim 8, wherein the power harvesting subsystem is configured to harvest power from one of an electrical conductor via inductive coupling, a thermal power source, a photovoltaic power source, and a piezoelectric power source.

11. The system of claim 8, further comprising a fault detection subsystem configured to detect an over-current condition;

wherein the signal comprises an indication of the over-current condition.

12. The system of claim 8, wherein the energy storage subsystem comprises a plurality of capacitors.

13. The system of claim 8, further comprising a transient-voltage-suppression subsystem.

14. A method for decreasing startup time of a line-mounted fault detector, the method comprising:

entering a startup state following energization of a conductor;

harvesting energy from a conductor using a power harvesting subsystem;

storing energy harvested from the conductor using an energy storage subsystem;

powering a fast-start power coupling subsystem using the energy from the energy storage subsystem;

powering a fast-start subsystem using the fast-start power coupling subsystem;

determining that a voltage of an output of the energy storage subsystem exceeds a threshold;

starting a DC-DC power converter subsystem;

transitioning from the startup state to an operating state by:
de-energizing the fast-start power coupling subsystem,
powering the fast-start subsystem using the DC-DC power converter subsystem;
energizing a fault detection subsystem, and
energizing a RF transmission subsystem;

detecting a fault using the fault detection subsystem; and transmitting an indication of the fault using the RF transmitter subsystem.

15. The method of claim 14, wherein the fast-start subsystem comprises a crystal oscillator and a phase-lock loop configured to generate a reference frequency for use by the RF transmitter subsystem.

16. The method of claim 14, wherein harvesting energy from the conductor comprises an inductive coupling to the electrical conductor.

17. The method of claim 14, wherein the fault comprises an over-current condition.

18. The method of claim 14, wherein transitioning from the startup state to the operating state comprises actuating a plurality of solid-state switches.

19. The method of claim 14, wherein the energy storage subsystem comprises a plurality of capacitors.

20. The method of claim 14, further comprising suppressing a transient voltage using a transient voltage suppression subsystem using a transient-voltage-suppression diode.

* * * * *